(12) United States Patent
Watanabe et al.

(10) Patent No.: US 8,575,610 B2
(45) Date of Patent: Nov. 5, 2013

(54) SEMICONDUCTOR DEVICE AND METHOD FOR DRIVING THE SAME

(75) Inventors: Kazunori Watanabe, Atsugi (JP); Makoto Yanagisawa, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 137 days.

(21) Appl. No.: 13/213,673

(22) Filed: Aug. 19, 2011

(65) Prior Publication Data

US 2012/0056646 A1 Mar. 8, 2012

(30) Foreign Application Priority Data

Sep. 2, 2010 (JP) .................................. 2010-196439

(51) Int. Cl.
*H01L 33/00* (2010.01)
(52) U.S. Cl.
USPC ............................................................ 257/59
(58) Field of Classification Search
USPC .............................. 257/59, 72, 335, 359, 409
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,646,301 B2 | 11/2003 | Yamada | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Nathan Ha
(74) *Attorney, Agent, or Firm* — Eric J. Robinson; Robinson Intellectual Property Law Office, P.C.

(57) ABSTRACT

An object is to alleviate the concentration of an electric field in a semiconductor device. A gate electrode and a drain electrode are provided not to overlap with each other, and an electric-field control electrode is provided between the gate electrode and the drain electrode over a top surface. Insulating layers are provided between the gate electrode and a semiconductor layer and between the electric-field control electrode and the semiconductor layer, and the insulating layer provided between the electric-field control electrode and the semiconductor layer has a larger thickness than the insulating layer provided between the gate electrode and the semiconductor layer. Further, when the semiconductor device is driven, the potential of the electric-field control electrode may be higher than or equal to a source potential and lower than a gate potential, and for example, connection between the electric-field control electrode and the source potential enables such a structure.

12 Claims, 16 Drawing Sheets

(56) References Cited

U.S. PATENT DOCUMENTS

| | | | |
|---|---|---|---|
| 7,105,868 B2 | 9/2006 | Nause et al. | |
| 7,145,169 B2 | 12/2006 | Saso et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,649,224 B2 * | 1/2010 | Kikuchi et al. | 257/342 |
| 7,674,650 B2 | 3/2010 | Akimoto et al. | |
| 7,709,908 B2 * | 5/2010 | Su et al. | 257/409 |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0074549 A1 * | 6/2002 | Park et al. | 257/59 |
| 2002/0132454 A1 | 9/2002 | Ohtsu et al. | |
| 2003/0080337 A1 * | 5/2003 | Yudasaka et al. | 257/59 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0286303 A1 | 12/2005 | Mirabel et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0115009 A1 | 5/2011 | Tan et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-167155 | 6/2005 |
| JP | 2005-191543 | 7/2005 |
| JP | 2007-096055 | 4/2007 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008 , vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2005, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Syposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 ; SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 :SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide FTF,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Paper, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE AND METHOD FOR DRIVING THE SAME

BACKGROUND OF THE INVENTION

1. Field of the Invention

The present invention relates to a semiconductor device and a method for driving the semiconductor device. Note that in this specification, the semiconductor device means a semiconductor element itself or a device including a semiconductor element. As such a semiconductor element, for example, a thin film transistor can be given. Therefore, the semiconductor device includes a liquid crystal display device and the like.

2. Description of the Related Art

In recent years, metal oxides having semiconductor characteristics (hereinafter, referred to as oxide semiconductors) have attracted attention. The metal oxides having semiconductor characteristics can be applied to transistors (e.g., Patent Document 1 and Patent Document 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

FIG. 2 illustrates an example of a semiconductor device in which an oxide semiconductor layer is provided.

The semiconductor device illustrated in FIG. 2 can be applied to, for example, a switch of an electric power circuit. In the case where the semiconductor device illustrated in FIG. 2 is used as a switch of an electric power circuit, a high withstand voltage with respect to a drain voltage (a potential difference between a drain potential and a source potential serving as a reference) is important. In the semiconductor device illustrated in FIG. 2, part of a gate electrode and part of a drain electrode overlap with each other. Therefore, when the drain voltage is increased, an electric field is concentrated in a certain portion, whereby dielectric breakdown easily occurs in a gate insulating film.

An object of one embodiment of the present invention is to alleviate the concentration of an electric field in the semiconductor device.

In the semiconductor device of an embodiment of the present invention, a gate electrode and a drain electrode do not overlap with each other, and an electric-field control electrode is provided between the gate electrode and the drain electrode over a top surface. Insulating layers are provided between the gate electrode and a semiconductor layer and between the electric-field control electrode and the semiconductor layer, and the insulating layer provided between the electric-field control electrode and the semiconductor layer has a larger thickness than the insulating layer provided between the gate electrode and the semiconductor layer. Further, when the semiconductor device is driven, the potential of the electric-field control electrode may be higher than or equal to a source potential and lower than a gate potential, and for example, connection between the electric-field control electrode and the source enables such a structure.

One embodiment of the present invention is a semiconductor device including a source electrode and a drain electrode that are apart from each other; a semiconductor layer that is in contact with the source electrode and the drain electrode; a first insulating layer that covers at least the semiconductor layer; a gate electrode that is provided over the first insulating layer to overlap with part of the semiconductor layer and the source electrode and not to overlap with the drain electrode; a second insulating layer that covers at least the gate electrode; and an electric-field control electrode that is provided over the second insulating layer to overlap with part of the semiconductor layer and a region between the gate electrode and the drain electrode. The electric-field control electrode is electrically connected to the source electrode.

One embodiment of the present invention is a method for driving a semiconductor device. The semiconductor device includes a source electrode and a drain electrode that are apart from each other; a semiconductor layer that is in contact with the source electrode and the drain electrode; a first insulating layer that covers at least the semiconductor layer; a gate electrode that is provided over the first insulating layer to overlap with part of the semiconductor layer and the source electrode and not to overlap with the drain; a second insulating layer that covers at least the gate electrode; and an electric-field control electrode that is provided over the second insulating layer to overlap with part of the semiconductor layer and a region between the gate electrode and the drain electrode. A potential of the electric-field control electrode is higher than or equal to a potential of the source electrode and lower than a potential of the gate electrode.

In the above structure, for example, an oxide semiconductor layer can be provided as the semiconductor layer.

In the semiconductor device that is one embodiment of the present invention, the concentration of an electric-field can be alleviated.

By a method for driving the semiconductor device that is one embodiment of the present invention, the concentration of an electric-field can be alleviated.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be interpreted as being limited to the description of the embodiments.

Embodiment 1

In this embodiment, a semiconductor device that is one embodiment of the present invention will be described.

Figure 1A:
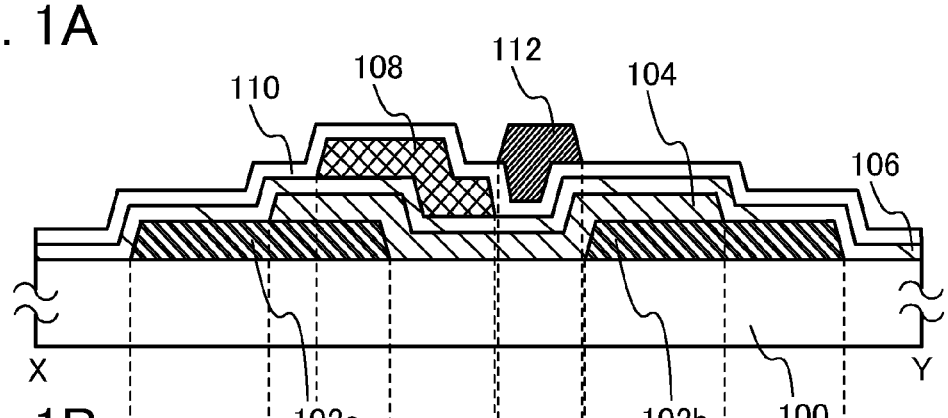
FIGS. 1A to 1C are a cross-sectional view and top views, which illustrate a semiconductor device that is one embodiment of the present invention.
Figure 1B:
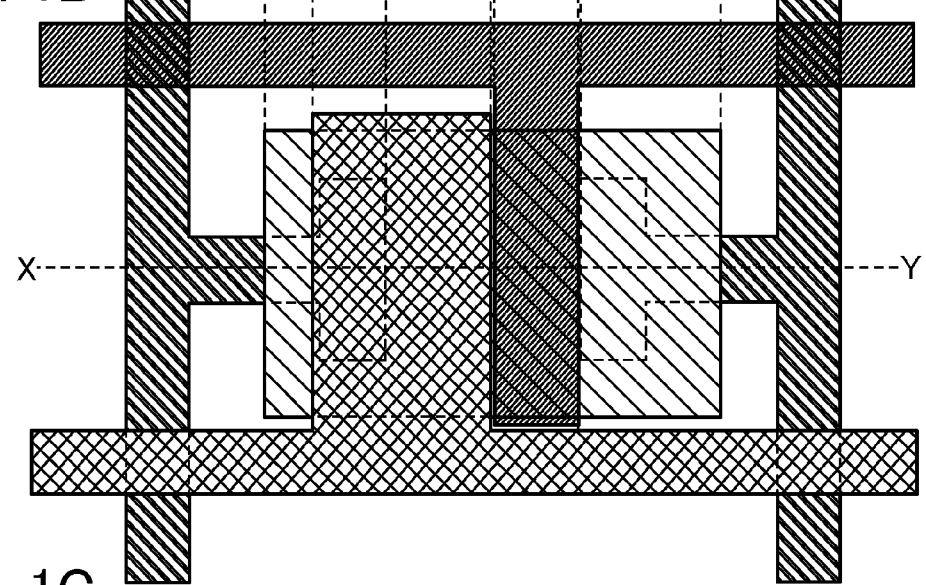
Figure 1C:
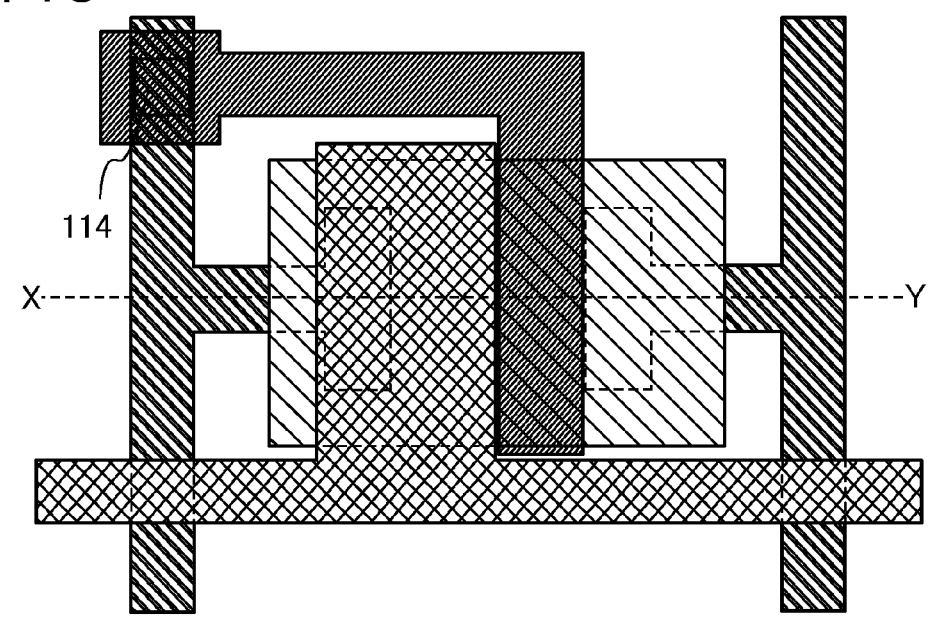

FIGS. 1A to 1C illustrate a semiconductor device that is one embodiment of the present invention. FIG. 1A is a cross-sectional view of the semiconductor device that is one embodiment of the present invention. FIGS. 1B and 1C are examples of a top view of the semiconductor device that is one embodiment of the present invention. Note that FIG. 1A is a cross-sectional view taken along line X-Y illustrated in FIGS. 1B and 1C.

The semiconductor device illustrated in FIG. 1A includes a source electrode 102a and a drain electrode 102b provided to be apart from each other over a substrate 100, a semiconductor layer 104 provided between and in contact with the source electrode 102a and the drain electrode 102b, a first insulating layer 106 provided to cover at least the semiconductor layer 104, a gate electrode 108 provided over the first insulating layer 106 to overlap with part of the semiconductor layer 104 and the source electrode 102a and not to overlap with the drain electrode 102b, a second insulating layer 110 provided to cover at least the gate electrode 108, and an electric-field control electrode 112 provided over the second insulating layer 110 to overlap with part of the semiconductor layer 104 and a region between the gate electrode 108 and the drain electrode 102b.

The substrate 100 is an insulating substrate. As the substrate 100, in addition to a glass substrate, a quartz substrate, and a ceramic substrate, a plastic substrate or the like with heat resistance that is high enough to withstand a process temperature in this manufacturing process can be used. In the case where the substrate 100 is a glass substrate, the substrate may have any size of from the first generation (e.g., 320 mm×400 mm) to the tenth generation (e.g., 2950 mm×3400 mm). However, the substrate 100 is not limited thereto. In the case where the semiconductor layer 104 is an oxide semiconductor layer, the semiconductor layer 104 is preferably provided with an insulating film formed by a sputtering method and from which hydrogen and moisture are removed.

Note that in the case of using a glass substrate as the substrate 100, one embodiment of the present invention can be applied to a display device. Therefore, also in the case where one embodiment of the present invention is applied to a switch of an electric power circuit formed over a substrate of a display device, the concentration of an electric field can be alleviated.

The source electrode 102a and the drain electrode 102b may be selectively formed in such a manner that, for example, a conductive film (e.g., a metal film or a semiconductor film to which an impurity element imparting one conductivity type is added) is formed by a sputtering method, an etching mask is formed over the conductive film, and etching is performed. Alternatively, an ink jet method may be used. Note that the conductive film to be the source electrode 102a and the drain electrode 102b may be formed with a single-layer structure or a structure in which a plurality of layers are stacked. For example, the conductive film may be formed with a three-layer structure in which an Al layer is sandwiched between Ti layers. Note that the source electrode 102a and the drain electrode 102b also serve as signal lines.

The semiconductor layer 104 may be selectively formed in such a manner that a semiconductor film is formed, an etching mask is formed over the semiconductor film, and etching is performed. Alternatively, the semiconductor layer 104 may be selectively formed by an ink jet method. The semiconductor film can be formed using an oxide semiconductor, for example.

The first insulating layer 106 may be formed by, for example, a sputtering method using an insulating material (e.g., silicon nitride, silicon nitride oxide, silicon oxynitride, or silicon oxide). Note that the first insulating layer 106 may be formed with a single-layer structure or a structure in which a plurality of layers are stacked. Here, the first insulating layer 106 is formed with a two-layer structure in which a silicon oxynitride layer is stacked over a silicon nitride layer, for example. Note that the first insulating layer 106 serves as at least a gate insulating layer. Note that in the case where the first insulating layer 106 is formed by a sputtering method, hydrogen and moisture can be prevented from entering the semiconductor layer 104.

Note that, silicon nitride oxide contains more nitrogen than oxygen. Note that silicon oxynitride contains more oxygen than nitrogen.

The gate electrode 108 may be formed using the same material and method as those of the source electrode 102a and the drain electrode 102b.

The second insulating layer 110 may be formed using the same material and method as those of the first insulating layer 106.

The electric-field control electrode 112 may be formed using the same material and method as those of the source electrode 102a and the drain electrode 102b.

As illustrated in FIG. 1B, the electric-field control electrode 112 may be provided electrically independently so as not to be connected to the gate electrode 108, the source electrode 102a, and the drain electrode 102b. In that case, the potential of the electric-field control electrode 112 may be a potential Vss. However, one embodiment of the present invention is not limited thereto. As illustrated in FIG. 1C, the electric-field control electrode 112 may be connected to the source electrode 102a in an opening portion 114.

Although not shown, the electric-field control electrode 112 may be provided between the source electrode 102a and the gate electrode 108, and a resistor may be provided between the source electrode 102a and the electric-field control electrode 112. In that case, the potential of the electric-field control electrode 112 is higher than 0 and lower than a gate potential due to the falling of a potential in the resistor.

Figure 15A:
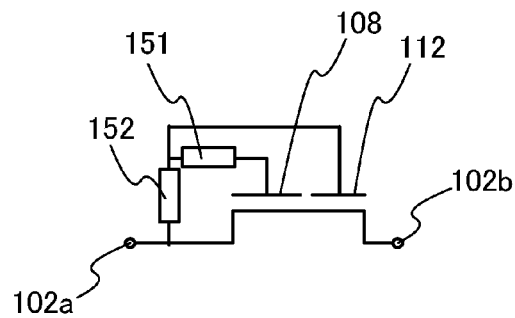
FIGS. 15A to 15C are a circuit diagram, a cross-sectional view, and a top view, which illustrate a semiconductor device that is one embodiment of the present invention.

Alternatively, connection illustrated in FIG. 15A may be employed. In a semiconductor device illustrated in FIG. 15A, a first resistor 151 and a second resistor 152 are provided between the source electrode 102a and the gate electrode 108, and the second resistor 152 is provided between the source electrode 102a and the electric-field control electrode 112. In that case, a potential $V_c$ of the electric-field control electrode 112 is represented by the following formula (1) where a source potential is $V_s$, the gate potential is $V_g$, a resistance value of the first resistor 151 is $R_1$, and a resistance value of the second resistor 152 is $R_2$.

[FORMULA 1]

$$V_c = \frac{R_2(V_g - V_s)}{R_1 + R_2} + V_s \quad (1)$$

Figure 15B:
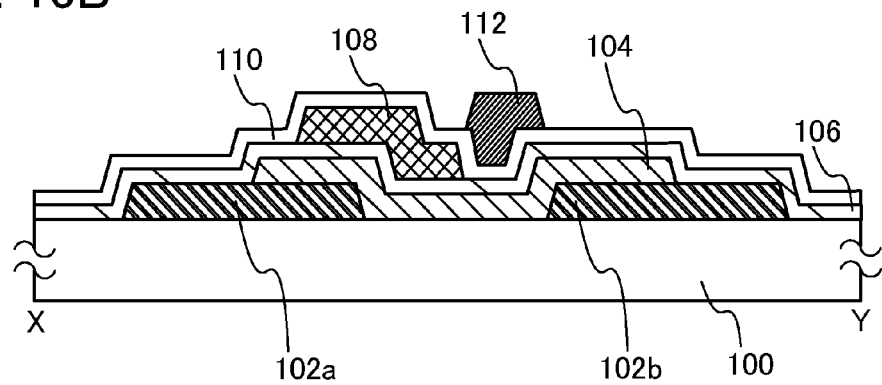

FIG. 15B is an example of a cross-sectional view of the semiconductor device illustrated in FIG. 15A. In a similar manner to the semiconductor device illustrated in FIG. 15A, the semiconductor device illustrated in FIG. 15B includes the source electrode 102a and the drain electrode 102b provided to be apart from each other over the substrate 100, the semiconductor layer 104 provided between and in contact with the source electrode 102a and the drain electrode 102b, the first insulating layer 106 provided to cover at least the semiconductor layer 104, the gate electrode 108 provided over the first insulating layer 106 to overlap with part of the semiconductor layer 104 and the source electrode 102a and not to overlap with the drain electrode 102b, the second insulating layer 110 provided to cover at least the gate electrode 108, and the electric-field control electrode 112 provided over the second insulating layer 110 to overlap with part of the semiconductor layer 104 and a region between the gate electrode 108 and the drain electrode 102b. Note that the cross-sectional view illustrated in FIG. 15B is a cross-sectional view taken along line X-Y of a top view illustrated in FIG. 15C and is not different from the cross-sectional view illustrated in FIG. 1A.

Figure 15C:
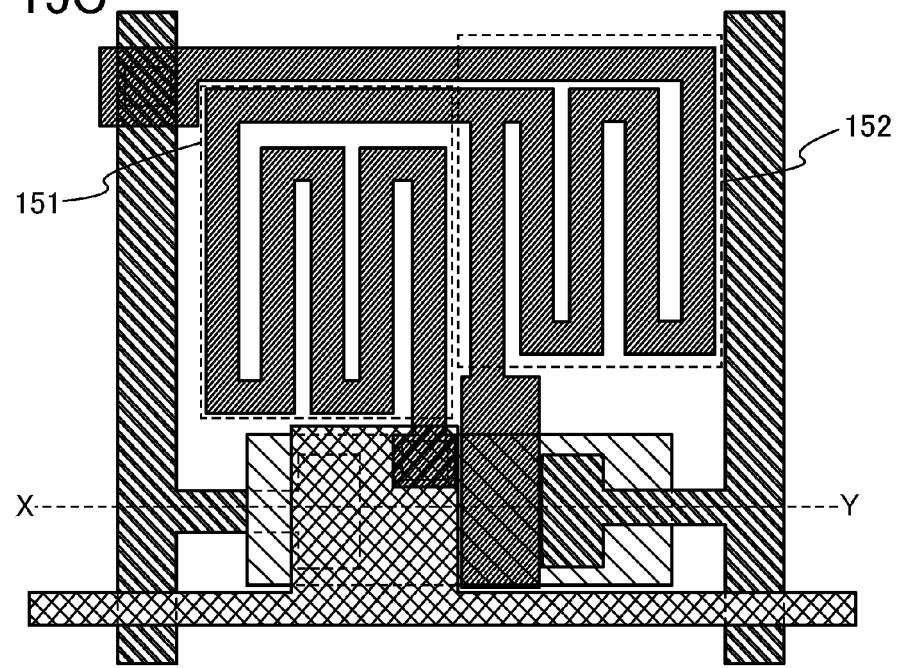

As illustrated in the top view of FIG. 15C, the first resistor 151 and the second resistor 152 can be formed using the same layer as the electric-field control electrode 112. As illustrated in the top view of FIG. 15C, the electric-field control electrode 112 can be formed by leading a wiring formed using a high resistance conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added, without complication of the manufacturing process.

Figure 2:
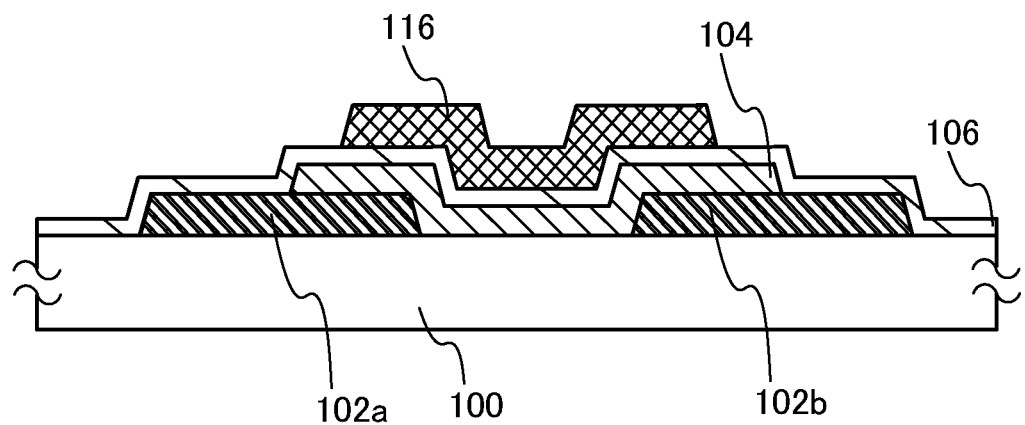
FIG. 2 is a cross-sectional view that is a comparative example of the semiconductor device of FIGS. 1A to 1C.

A semiconductor device illustrated in FIG. 2 is a comparative example of the semiconductor device illustrated in FIGS. 1A to 1C. In the case where the semiconductor device is used as a switch of an electric power circuit, a high withstand voltage with respect to a drain voltage (a potential difference between a drain potential and a source potential serving as a reference) is important. In the semiconductor device illustrated in FIG. 2, part of a gate electrode 116 and part of the drain electrode 102b overlap with each other. Therefore, as the drain voltage is increased, an electric field becomes concentrated in a certain portion. Accordingly, there is a problem in that dielectric breakdown easily occurs in a gate insulating film.

In view of the above problem, as illustrated in FIGS. 1A to 1C, the gate electrode 108 and the drain electrode 102b do not overlap with each other, the electric-field control electrode 112 is provided in a region between the gate electrode 108 and the drain electrode 102b, and further, the second insulating layer 110 is provided in a region between the gate electrode 108 and the electric-field control electrode 112, so that the distance between the electric-field control electrode 112 and the semiconductor layer 104 is made longer than the distance between the gate electrode 108 and the semiconductor layer 104. As a result, the electric-field control electrode 112 can sufficiently alleviate the concentration of the electric field in the semiconductor layer 104.

Here, a method for manufacturing the semiconductor device illustrated in FIGS. 1A to 1C is described with reference to FIGS. 3A to 3D.

Figure 3A:
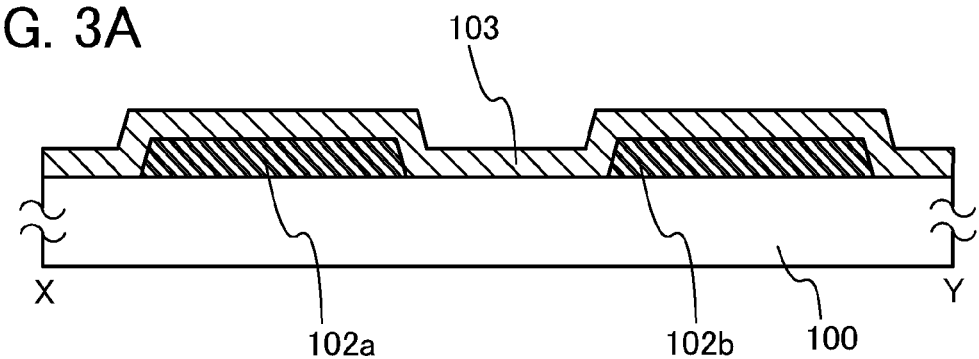
FIGS. 3A to 3D illustrate a method for manufacturing the semiconductor device of FIGS. 1A to 1C.

First, a first conductive film is formed over the substrate 100, a first etching mask is formed over the first conductive film, and etching is performed, whereby the source electrode 102a and the drain electrode 102b are formed. Then, a semiconductor film 103 is formed to cover the source electrode 102a and the drain electrode 102b (FIG. 3A).

Here, the semiconductor film 103 is preferably formed using an oxide semiconductor film. In the example described below, the semiconductor film 103 is formed using an oxide semiconductor film.

An oxide semiconductor for forming the semiconductor film 103 preferably contains at least indium (In) or zinc (Zn). In particular, both In and Zn are preferably contained. In addition, gallium (Ga) is preferably contained. When gallium (Ga) is contained, variation in the transistor characteristics can be reduced. Such an element capable of reducing variation in the transistor characteristics is referred to as a stabilizer. As a stabilizer, tin (Sn), hafnium (Hf), and aluminum (Al), can be given.

As a stabilizer, lanthanoid such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu) can also be given. One or a plurality of these elements can be used.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), a Sn—Ga—Zn-based oxide, an Al—Ga—Zn-based oxide, a Sn—Al—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be given.

Note that here, for example, an In—Ga—Zn-based oxide means an oxide containing In, Ga, and Zn as its main component, in which there is no particular limitation on the ratio of In:Ga:Zn. The In—Ga—Zn-based oxide may contain a metal element other than the In, Ga, and Zn.

For example, it is possible to use an In—Ga—Zn-based oxide with an atomic ratio of In:Ga:Zn=1:1:1 (=1/3:1/3:1/3)

or In:Ga:Zn=2:2:1 (=2/5:2/5:1/5), or any of oxides whose composition is in the neighborhood of the above compositions. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the oxide semiconductor film which can be used in one embodiment of the present invention is not limited to those described above, and an oxide semiconductor film including an appropriate composition may be used in accordance with needed semiconductor characteristics (the mobility, the threshold value, the variation, and the like). In accordance with needed transistor characteristics (semiconductor characteristics), the carrier density, the impurity concentration, the defect density, the atomic ratio of a metal element and oxygen, the interatomic distance, the density, and the like may be appropriately adjusted.

For example, relatively high mobility can be obtained with the use of an In—Sn—Zn-based oxide. Further, the mobility can be increased by reducing the defect density in the bulk also in the case of using the In—Ga—Zn-based oxide.

The filling rate of an oxide target is higher than or equal to 90% and lower than or equal to 100%, preferably higher than or equal to 95% and lower than or equal to 99.9%. With the use of the metal oxide target having such a high filling rate, the oxide semiconductor film to be formed can be a dense film.

The oxide semiconductor film is formed over the substrate in such a manner that a sputtering gas from which hydrogen, water, a hydroxyl group, hydride, or the like is removed is introduced into a treatment chamber and a metal oxide target is used while the substrate is held in the treatment chamber in a reduced pressure state and moisture remaining in the treatment chamber is removed. The oxide semiconductor film may be formed while the substrate is heated.

As the sputtering gas used for forming the oxide semiconductor film, a high purity gas is preferably used in which impurities such as hydrogen, water, a hydroxyl group, or hydride are reduced to a concentration of 1 ppm or lower (preferably, 10 ppb or lower).

Figure 3B:
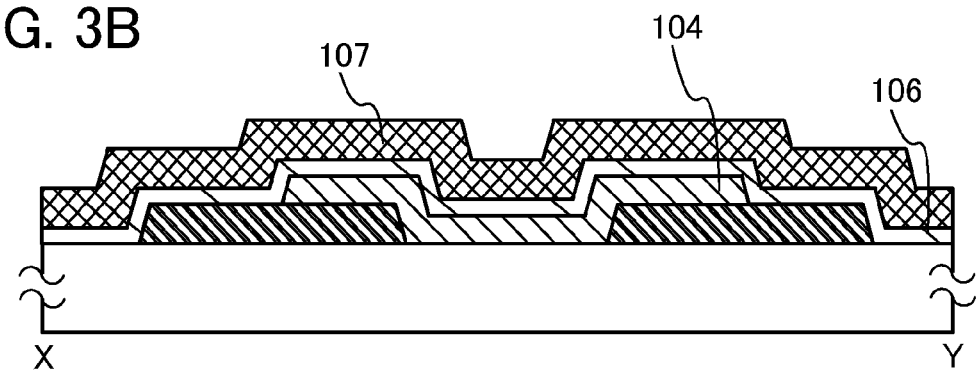

Next, a second etching mask is formed over the semiconductor film 103 and etching is performed, whereby the semiconductor layer 104 is formed. Then, the first insulating layer 106 is formed to cover the semiconductor layer 104, and a second conductive film 107 is formed over the first insulating layer 106 (FIG. 3B).

Here, in the state where the semiconductor layer 104 is formed, first heat treatment is preferably performed. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, and heat treatment is performed on the oxide semiconductor film in an inert gas atmosphere, such as a nitrogen atmosphere or a rare gas atmosphere, at 450° C. for one hour, and then the oxide semiconductor film is not exposed to air. Accordingly, hydrogen, water, hydroxyl groups, hydride, and the like can be prevented from entering the oxide semiconductor film, and the hydrogen concentration is reduced, whereby an i-type oxide semiconductor film or a substantially i-type oxide semiconductor film can be obtained. That is, at least one of dehydration and dehydrogenation of the oxide semiconductor layer can be performed by this first heat treatment.

Note that it is preferable that in the first heat treatment, hydrogen, water, a hydroxyl group, hydride, and the like be not contained in a nitrogen gas or a rare gas such as a helium gas, a neon gas, or an argon gas. Alternatively, the purity of a nitrogen gas or a rare gas such as a helium gas, a neon gas, or an argon that is introduced into the heat treatment apparatus is preferably 6N (99.9999%) or higher, more preferably 7N (99.99999%) or higher (that is, the impurity concentration is 1 ppm or lower, preferably 0.1 ppm or lower).

Further, the oxide semiconductor layer may be crystallized to be a microcrystalline layer or a polycrystalline layer depending on the condition of the first heat treatment or a material of the oxide semiconductor layer. For example, the oxide semiconductor layer may be crystallized into a microcrystalline oxide semiconductor layer having a degree of crystallization of greater than or equal to 90%, or greater than or equal to 80%. The oxide semiconductor layer may become an amorphous oxide semiconductor layer containing no crystalline component depending on the condition of the first heat treatment or the material of the oxide semiconductor layer. Further, the oxide semiconductor layer may become an oxide semiconductor layer in which a microcrystalline portion (with a grain diameter greater than or equal to 1 nm and less than or equal to 20 nm, typically greater than or equal to 2 nm and less than or equal to 4 nm) is mixed into an amorphous oxide semiconductor layer.

The first heat treatment of the oxide semiconductor layer may be performed on the oxide semiconductor film (the semiconductor film 103) before being processed into the island-shaped oxide semiconductor layer. In that case, the substrate is taken out from the heat apparatus after the first heat treatment, and then a photolithography step is performed.

In addition, second heat treatment (preferably at a temperature higher than or equal to 200° C. and lower than or equal to 400° C., for example, at a temperature higher than or equal to 250° C. and lower than or equal to 350° C.) may be performed in an inert gas atmosphere or an oxygen gas atmosphere. Hydrogen or moisture contained in the oxide semiconductor film can be diffused into the gate insulating film by the heat treatment.

Note that the first heat treatment may be performed after the semiconductor film 103 is formed using an oxide semiconductor and before the semiconductor layer 104 is formed. Further, the second heat treatment may be performed after the first insulating layer 106 is formed over the semiconductor layer 104 or after the second conductive film 107 is formed.

Figure 3C:
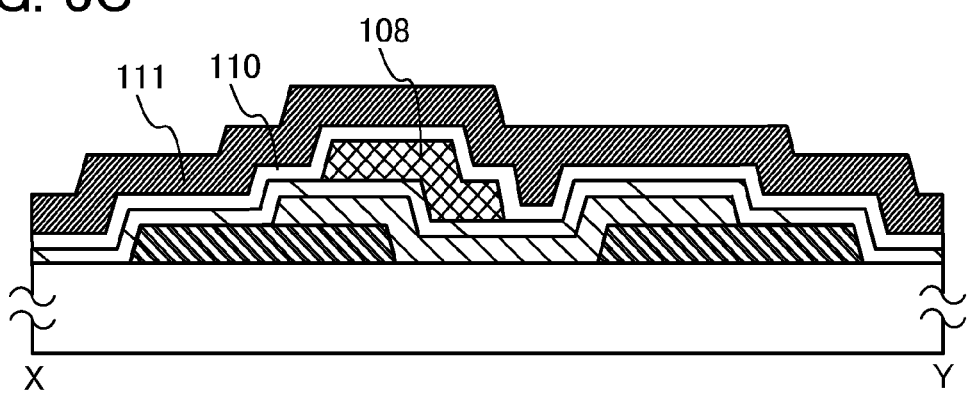

Next, a third etching mask is formed over the second conductive film 107 and etching is performed, whereby the gate electrode 108 is formed. Then, the second insulating layer 110 is formed to cover the gate electrode 108, and a third conductive film 111 is formed over the second insulating layer 110 (FIG. 3C).

Figure 3D:
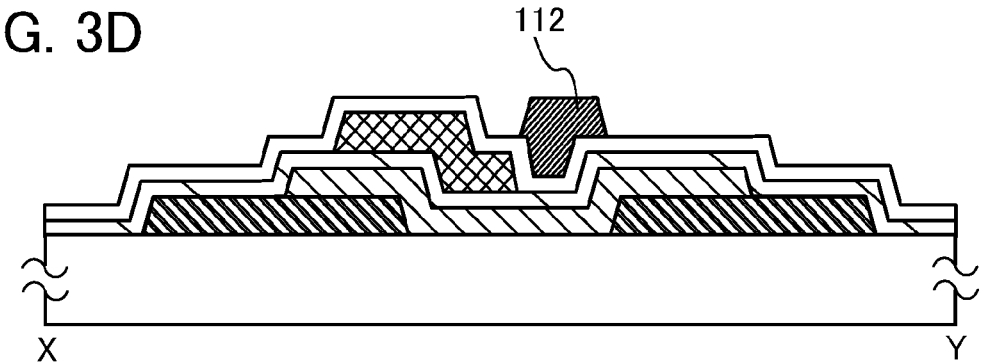

Next, a fourth etching mask is formed over the third conductive film 111 and etching is performed, whereby the electric-field control electrode 112 is formed (FIG. 3D).

In this manner, the semiconductor device illustrated in FIGS. 1A to 1C can be manufactured.

Next, results of a calculation which was performed on the semiconductor device illustrated in FIGS. 1A to 1C are described below.

Here, the calculation was performed in a condition of Table 1 described below.

TABLE 1

| | |
|---|---|
| Donor density [cm$^{-3}$] | $1 \times 10^{13}$ |
| Dielectric constant of the insulating layer | 4.0 |
| Dielectric constant of the semiconductor layer | 15.0 |
| Carrier mobility in the semiconductor layer [cm$^2$/V•s] | 7.0 |

TABLE 1-continued

| | |
|---|---|
| Work function of the semiconductor layer [eV] | 4.3 |
| Forbidden band width of the semiconductor layer [eV] | 3.15 |
| Effective density of states of conduction band [cm$^{-3}$] | $5 \times 10^{18}$ |
| Effective density of states of valence band [cm$^{-3}$] | $5 \times 10^{18}$ |
| Work function of the gate electrode layer [eV] | 4.6 |
| Work function of the source electrode layer [eV] | 4.3 |
| Work function of the drain electrode layer [eV] | 4.3 |

Note that the effective density of states is obtained at a temperature of 300 K and the values are obtained on the assumption that tungsten is used for the gate electrode and titanium is used for the source electrode and the drain electrode.

Figure 4:
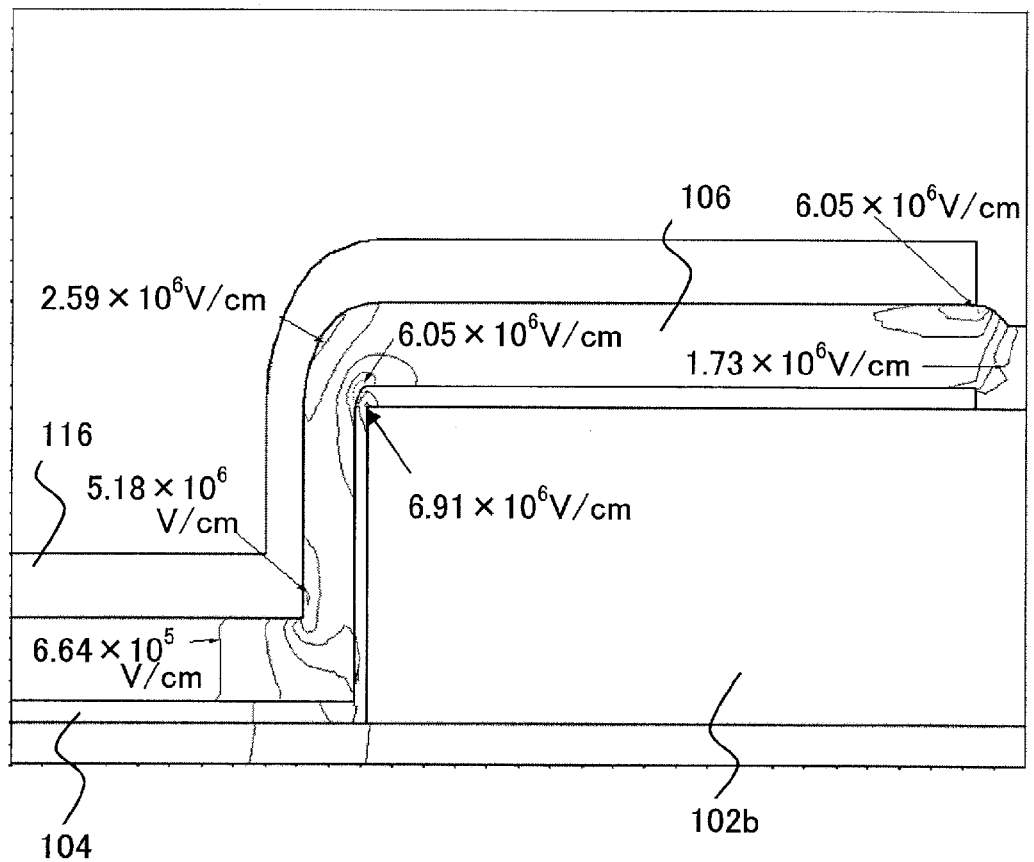
FIG. 4 shows calculation results of an electric-field distribution.

FIG. 4 shows calculation results of an electric-field distribution of an embodiment that is the same as FIG. 2. That is, FIG. 4 has a structure in which part of the gate electrode 116 and part of the drain electrode 102b overlap with each other, the electric field strength is the largest in a portion where the semiconductor layer 104 gets over the drain electrode 102b, and the largest electric field is $6.91 \times 10^6$ [V/cm].

On the other hand, FIG. 5 has a structure in which the gate electrode 108 and the drain electrode 102b do not overlap with each other, the electric field strength is the largest in a portion directly below an edge portion of the gate electrode 108, and the largest electric field is $2.95 \times 10^6$ [V/cm].

Figure 5:
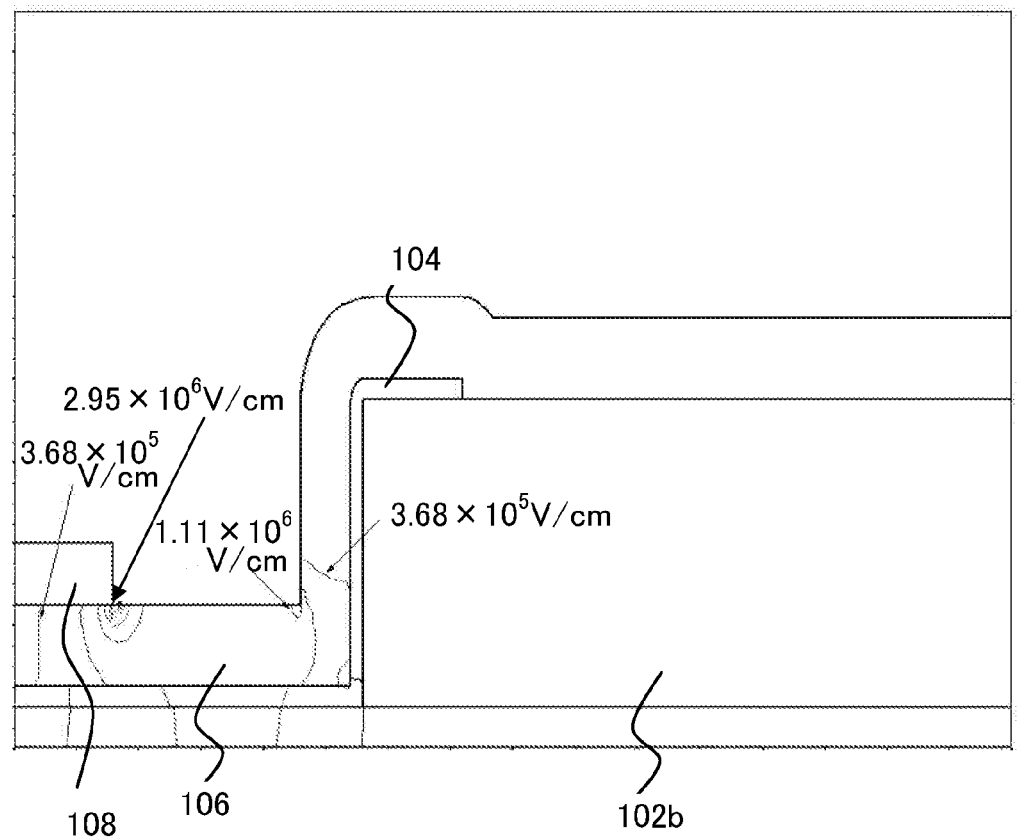
FIG. 5 shows calculation results of an electric-field distribution.
Figure 6:
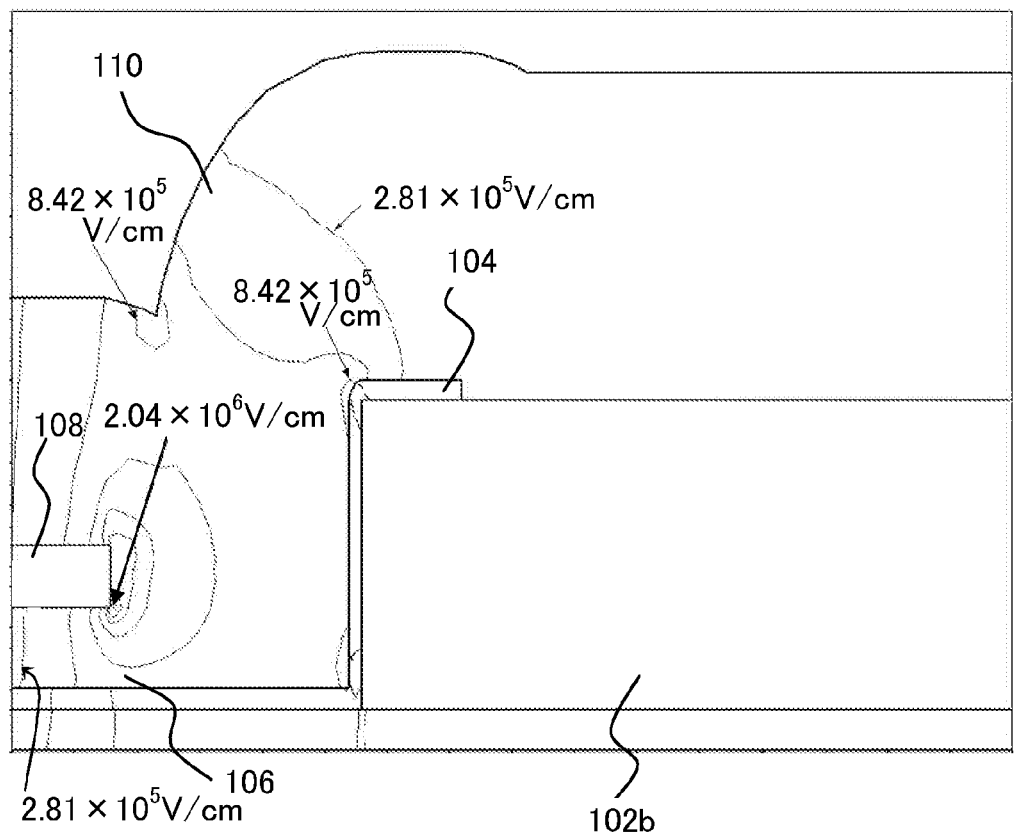
FIG. 6 shows calculation results of an electric-field distribution.

FIG. 6 has a structure in which the gate electrode and the drain electrode do not overlap with each other and the second insulating layer 110 is provided over the gate electrode 108, differently from FIG. 4. Here, in a similar manner to FIG. 5, the electric field strength is the largest in a portion directly below the edge portion of the gate electrode 108, and the largest electric field is $2.04 \times 10^6$ [V/cm].

Figure 7:
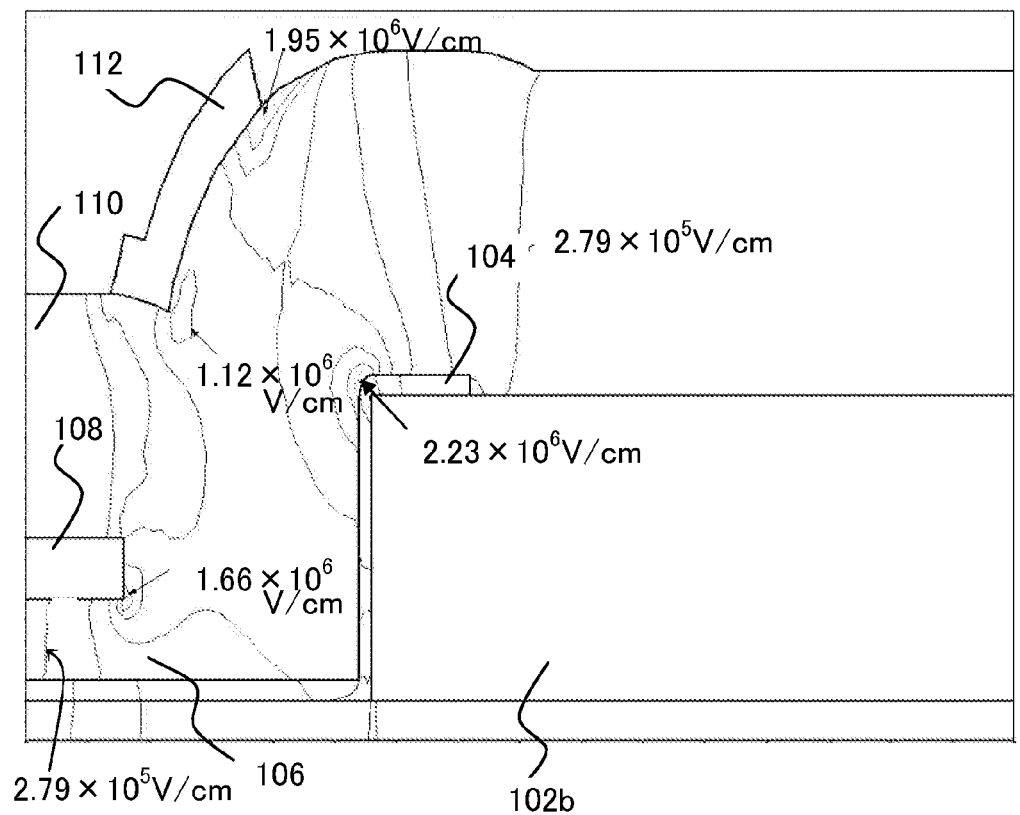
FIG. 7 shows calculation results of an electric-field distribution.

FIG. 7 has a structure in which the electric-field control electrode 112 overlaps with the semiconductor layer between the drain electrode 102b and the gate electrode 108 of FIG. 6. Here, the electric field strength is the largest in a portion directly above an edge portion of the drain electrode 102b, and the largest electric field is $2.23 \times 10^6$ [V/cm]. In addition, the electric field in the portion directly below the edge portion of the gate electrode 108 is $1.66 \times 10^6$ [V/cm]. Note that here, the potential of the electric-field control electrode 112 is the same as the potential of the source.

It can be found from comparisons between FIG. 4 to FIG. 7 that the electric field strength obtained in the lower portion of the gate electrode is the smallest in the structure of FIG. 7, and the electric field in the vicinity of the gate electrode can be effectively alleviated by the electric-field control electrode 112.

Here, calculation results of current density distributions in the structures of FIG. 4 to FIG. 7 are shown in FIG. 8 to FIG. 11.

Figure 8:
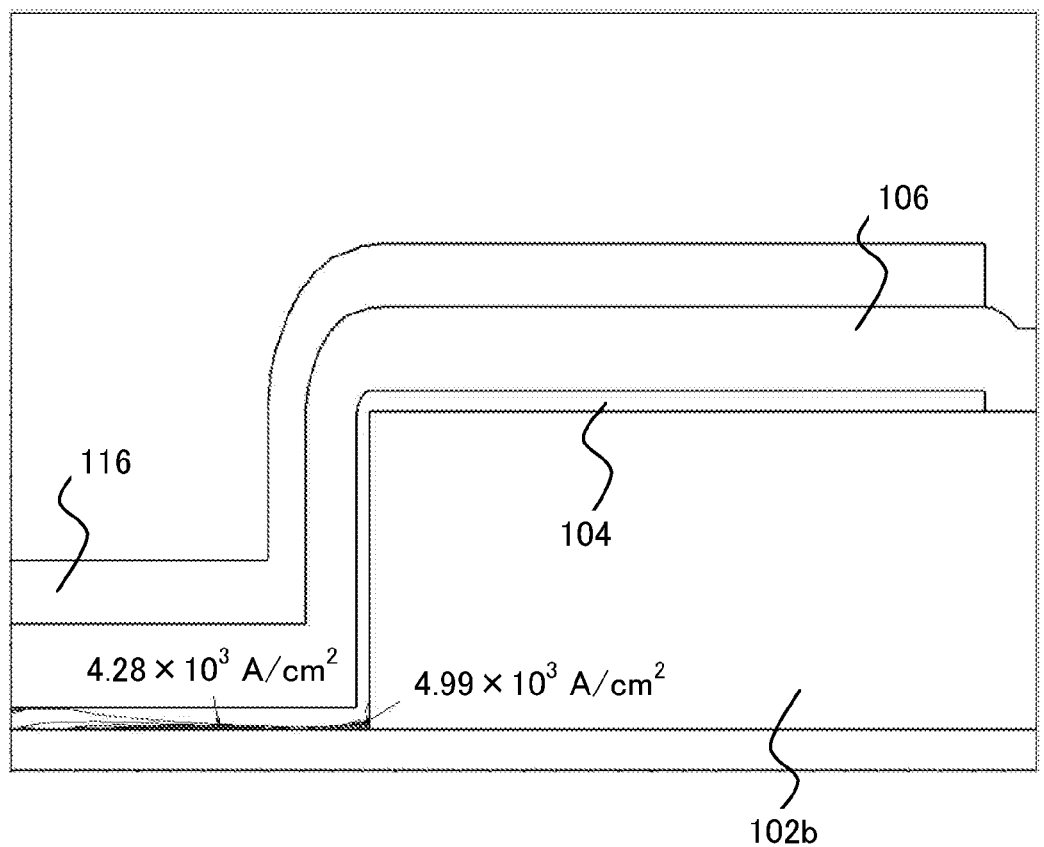
FIG. 8 shows calculation results of a current density distribution.

FIG. 8 shows a current density distribution in the structure of FIG. 4.

Figure 9:
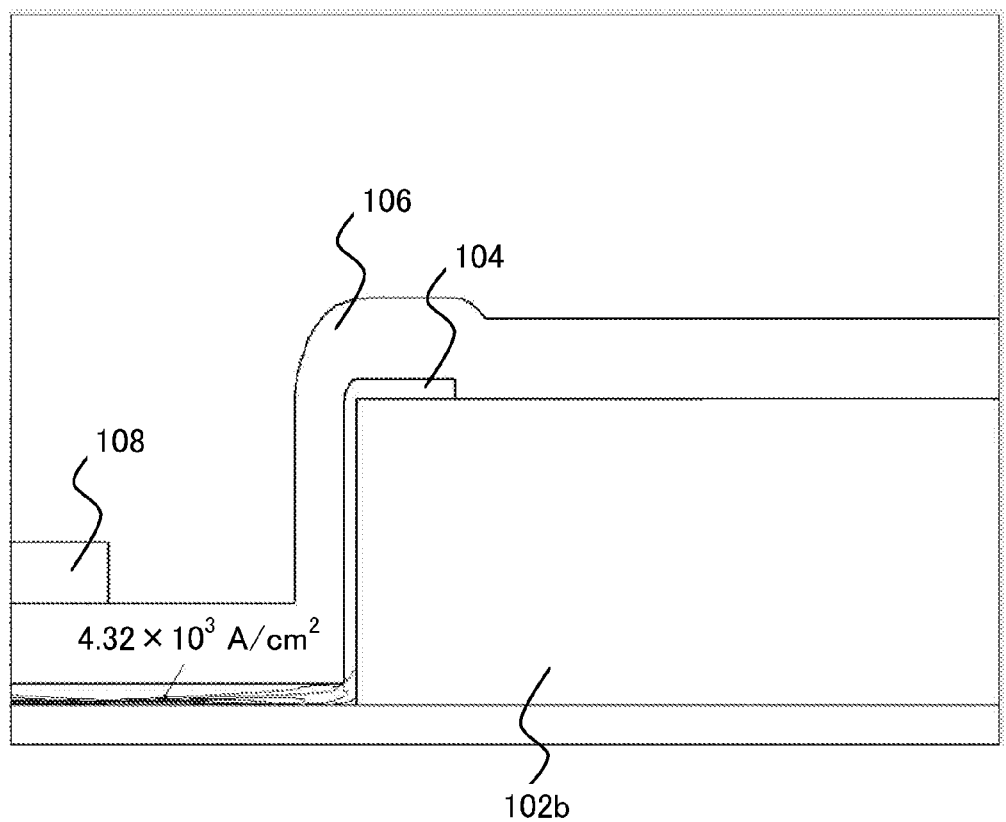
FIG. 9 shows calculation results of a current density distribution.

FIG. 9 shows a current density distribution in the structure of FIG. 5.

Figure 10:
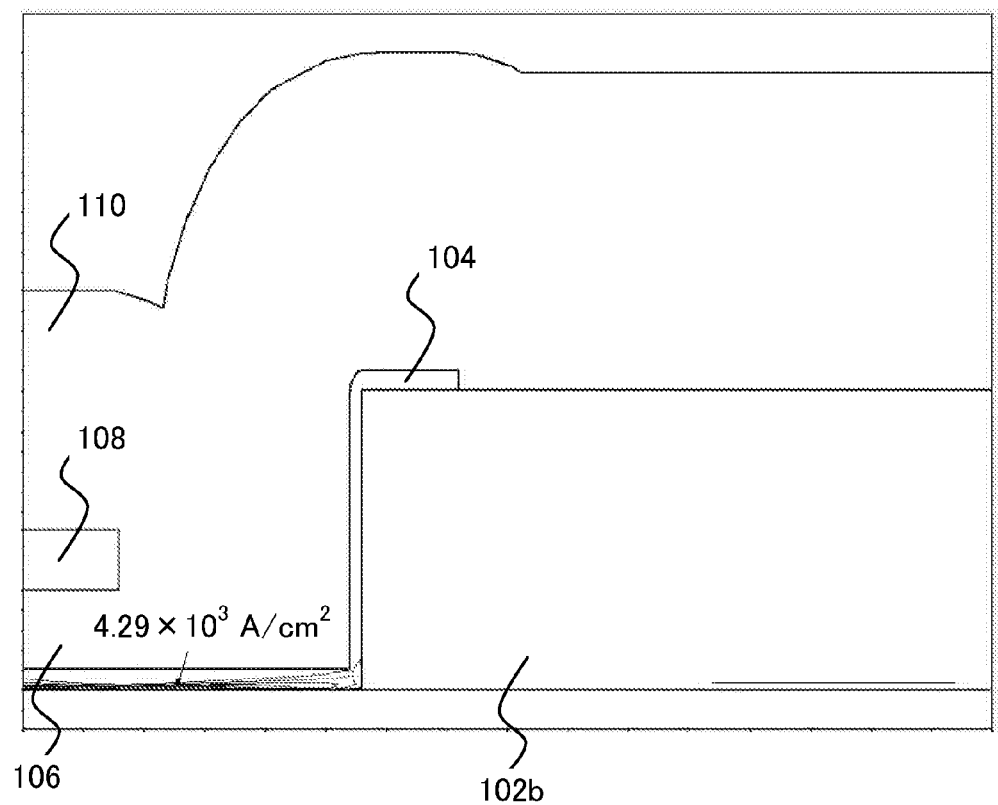
FIG. 10 shows calculation results of a current density distribution.

FIG. 10 shows a current density distribution in the structure of FIG. 6.

Figure 11:
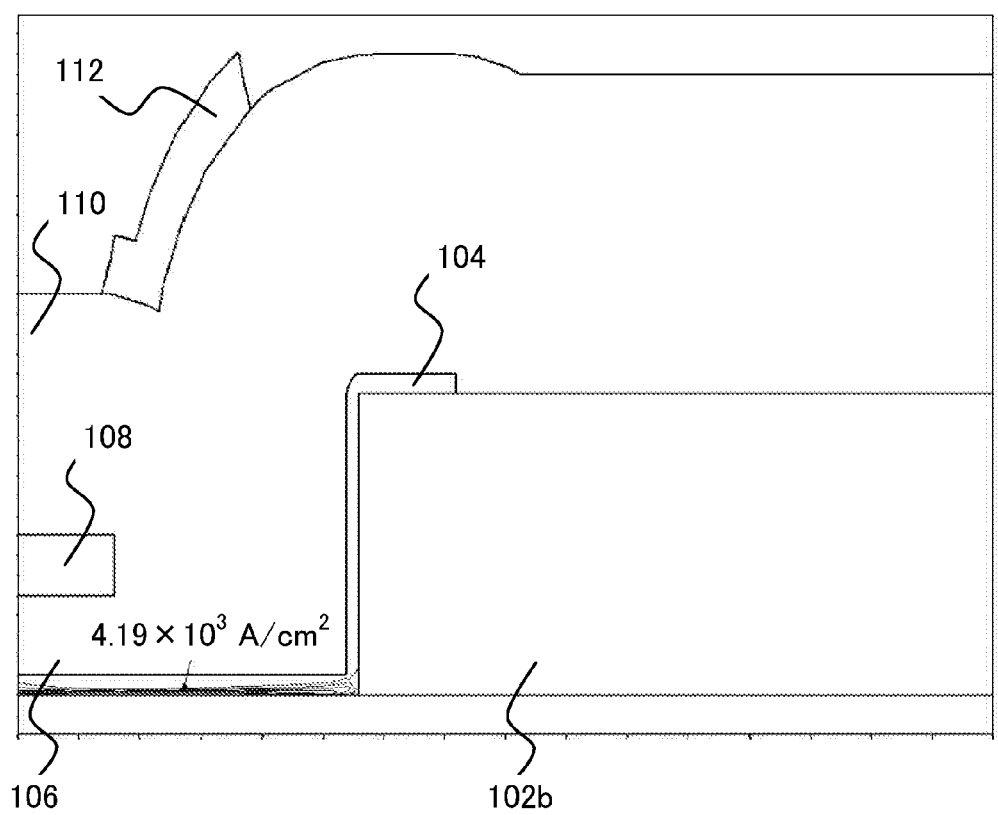
FIG. 11 shows calculation results of a current density distribution.

FIG. 11 shows a current density distribution in the structure of FIG. 7.

Figure 16:
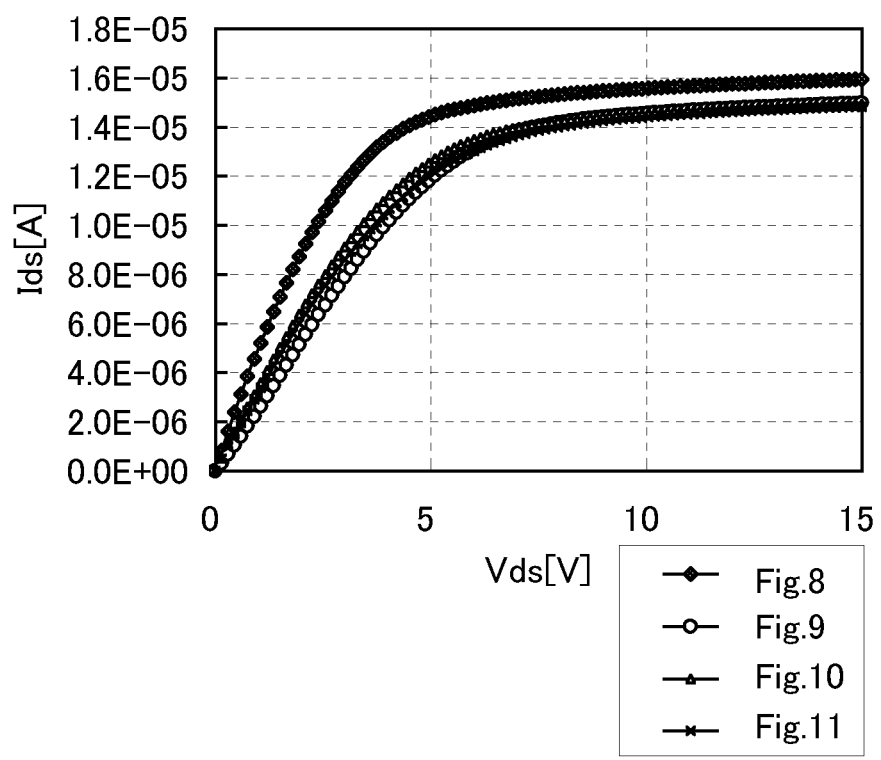
FIG. 16 shows calculation results of a current density distribution for comparison.

FIG. 16 shows a relation between the drain voltage (Vds) and the drain current (Ids) in the case where the gate voltage is fixed to 5 V in FIG. 8 to FIG. 11. In addition, drain current values in the case of the drain voltage of 10 V are shown in Table 2. Further, Table 2 also shows percentages of the drain current values of FIG. 9 to FIG. 11 with respect to the drain current value of FIG. 8 in the case of the drain voltage of 10 V.

TABLE 2

| Structure | Ids [A] | Percentage [%] |
|---|---|---|
| FIG. 8 | $1.56 \times 10^{-5}$ | — |
| FIG. 9 | $1.46 \times 10^{-5}$ | 93.5 |
| FIG. 10 | $1.46 \times 10^{-5}$ | 93.5 |
| FIG. 11 | $1.44 \times 10^{-5}$ | 92.5 |

As found from FIG. 16 and Table 2, the current density distribution in the structure of FIG. 11 is not largely different from the current density distributions of the structures of FIG. 8 to FIG. 10, and the electric field in the vicinity of the gate electrode can be effectively alleviated without influence on the drain current.

From the description made above, it can be confirmed that the concentration of the electric field in the semiconductor layer is sufficiently alleviated in the semiconductor device illustrated in FIGS. 1A to 1C.

Embodiment 2

A semiconductor device that is one embodiment of the present invention is not limited to the structure described in Embodiment 1. In this embodiment, a semiconductor device that is one embodiment of the present invention and is different from that of Embodiment 1 will be described.

Figure 12A:
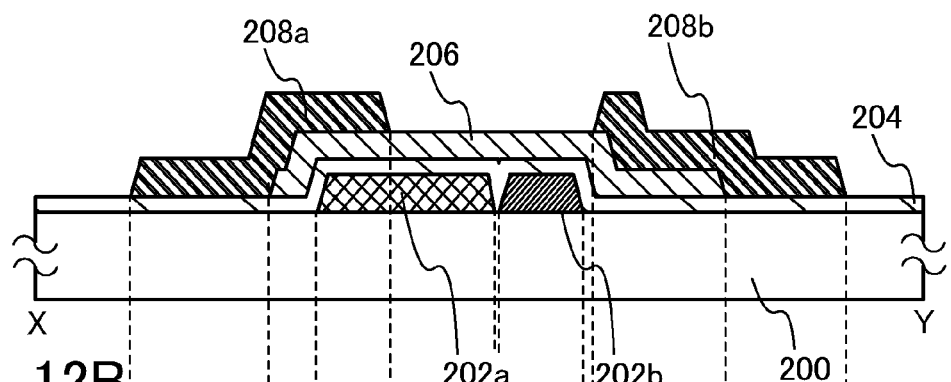
FIGS. 12A to 12C are a cross-sectional view and top views, which illustrate a semiconductor device that is one embodiment of the present invention.
Figure 12B:
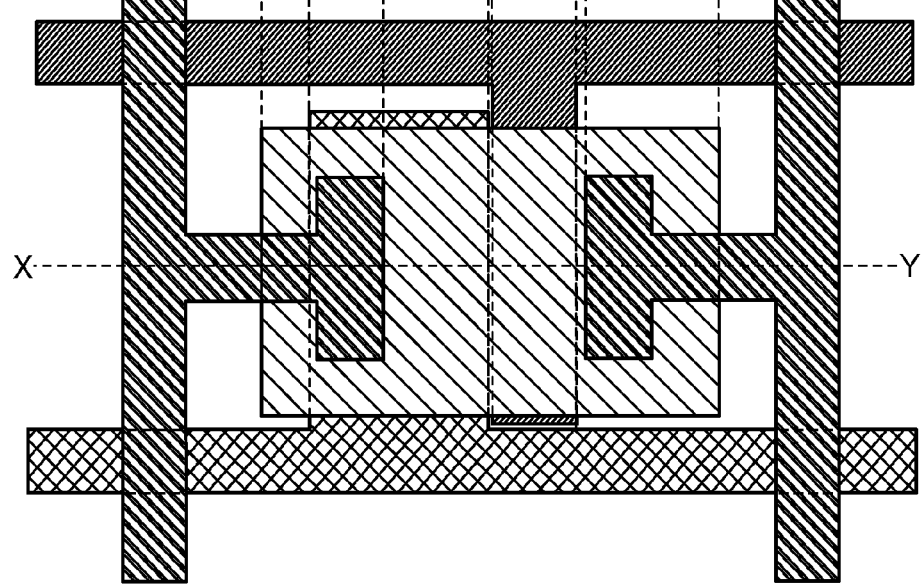
Figure 12C:
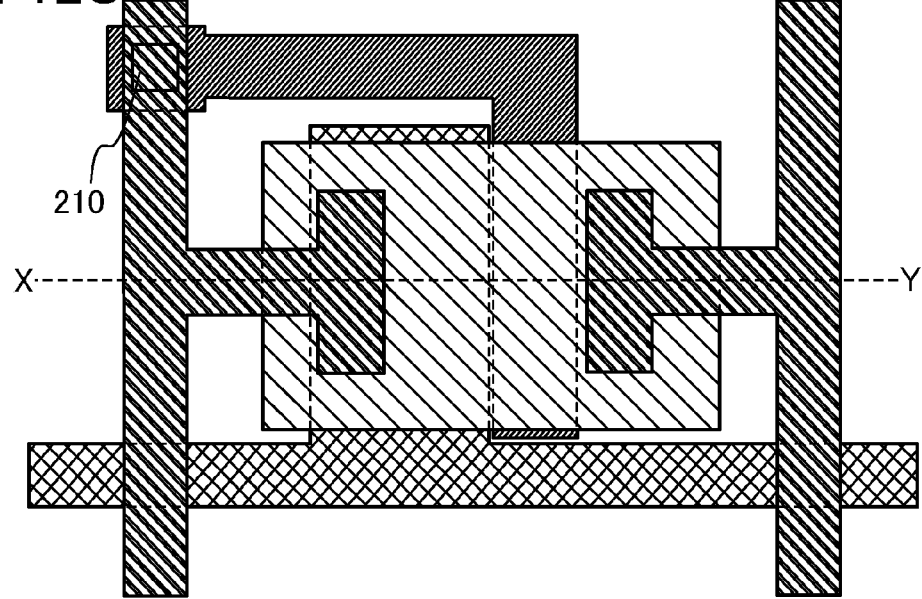

FIGS. 12A to 12C illustrate a semiconductor device of this embodiment. FIG. 12A is a cross-sectional view of the semiconductor device that is one embodiment of the present invention. FIG. 12B is an example of a top view of the semiconductor device of this embodiment. FIG. 12C is another example of a top view of the semiconductor device of this embodiment. Note that FIG. 12A is a cross-sectional view taken along line X-Y of in FIG. 12B and FIG. 12C.

The semiconductor device illustrated in FIGS. 12A and 12B includes a gate electrode 202a and an electric-field control electrode 202b provided over a substrate 200 to be apart from each other, a first insulating layer 204 provided to cover the gate electrode 202a and the electric-field control electrode 202b, a semiconductor layer 206 provided over the first insulating layer 204 to overlap with the gate electrode 202a and the electric-field control electrode 202b, a source electrode 208a provided on and in contact with the semiconductor layer 206 to overlap with the gate electrode 202a, and a drain electrode 208b provided over the semiconductor layer 206 to be apart from the source electrode 208a and not to overlap with the electric-field control electrode 202b.

Note that the potential of the electric-field control electrode 202b may be higher than or equal to the potential of the source electrode 208a and lower than the potential of the gate electrode 202a. It is preferable that the electric-field control electrode 202b be connected to the source electrode 208a through an opening portion 210 as illustrated in FIG. 12C.

Embodiment 3

A semiconductor device that is one embodiment of the present invention is not limited to the structures described in Embodiment 1 and Embodiment 2. In this embodiment, a semiconductor device that is one embodiment of the present invention and is different from those in Embodiment 1 and Embodiment 2 will be described.

Figure 13A:
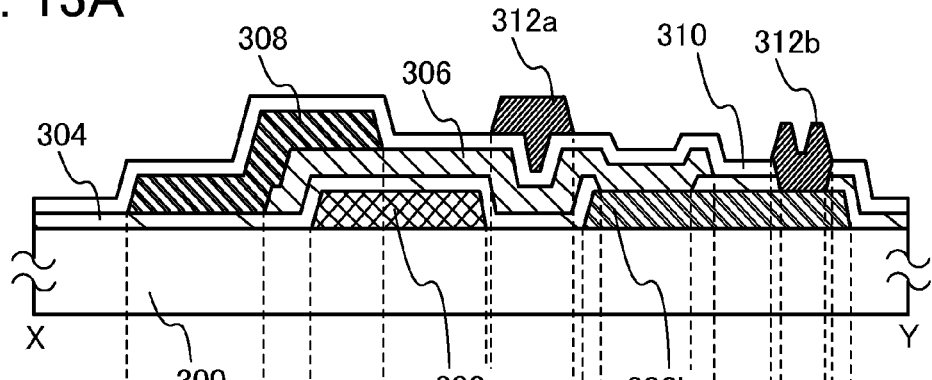
FIGS. 13A to 13C are a cross-sectional view and top views, which illustrate a semiconductor device that is one embodiment of the present invention.
Figure 13B:
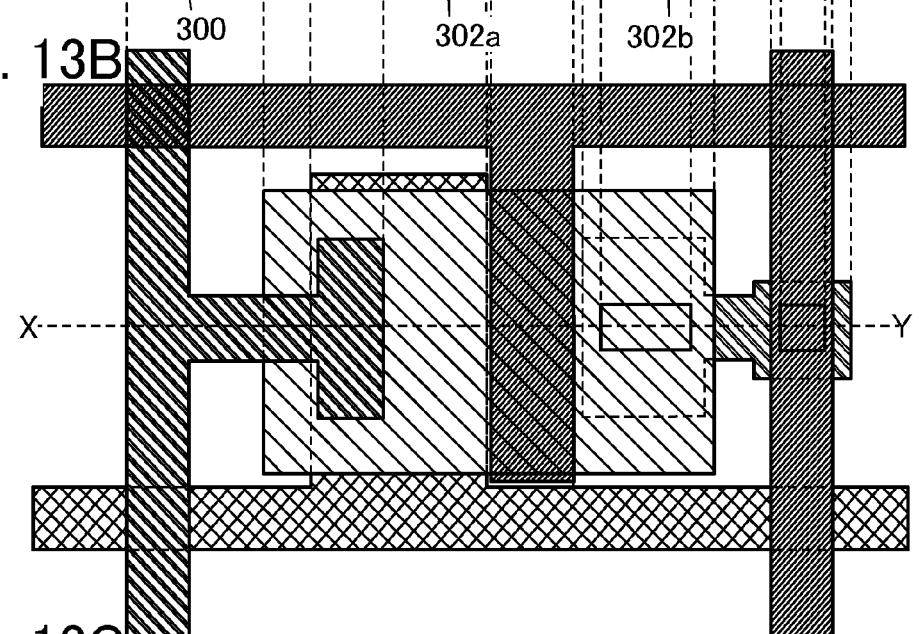
Figure 13C:
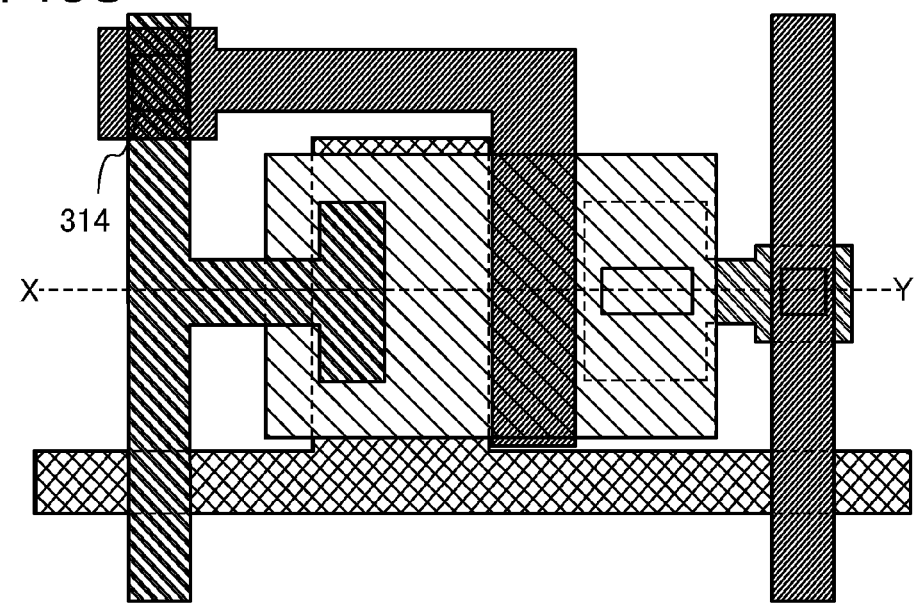

FIGS. 13A to 13C illustrate the semiconductor device of this embodiment. FIG. 13A is a cross-sectional view of the semiconductor device that is one embodiment of the present invention. FIG. 13B is an example of a top view of the semiconductor device of this embodiment. FIG. 13C is another example of a top view of the semiconductor device of this embodiment. Note that FIG. 13A is a cross-sectional view taken along line X-Y illustrated in FIGS. 13B and 13C.

The semiconductor device illustrated in FIGS. 13A and 13B includes a gate electrode 302a and a drain electrode 302b provided over a substrate 300 to be apart from each other, a first insulating layer 304 provided to cover the gate electrode 302a and the drain electrode 302b and including an opening portion from which the drain electrode 302b is exposed, a semiconductor layer 306 provided on and in contact with the drain electrode 302b to overlap with the gate electrode 302a, a source electrode 308 provided on and in contact with the semiconductor layer 306 to overlap with the gate electrode 302a, a second insulating layer 310 provided over at least the semiconductor layer 306, an electric-field control electrode 312a provided over the second insulating layer 310 to overlap with a region between the gate electrode 302a and the drain electrode 302b, and a wiring 312b provided in contact with the drain electrode 302b and over the second insulating layer 310.

Note that the potential of the electric-field control electrode 312a may be higher than or equal to the potential of the source electrode 308 and lower than the potential of the gate electrode 302a. The electric-field control electrode 312a is preferably connected to the source electrode 308 through an opening portion 314 as illustrated in FIG. 13C.

Note that without limitation to the structure illustrated in FIGS. 13A to 13C, the wiring 312b may be formed using the same layer as the source electrode 308.

Embodiment 4

A semiconductor device that is one embodiment of the present invention is not limited to the structures described in Embodiment 1 to Embodiment 3. In this embodiment, a semiconductor device that is one embodiment of the present invention and is different from those of Embodiment 1 to Embodiment 3 will be described.

Figure 14A:
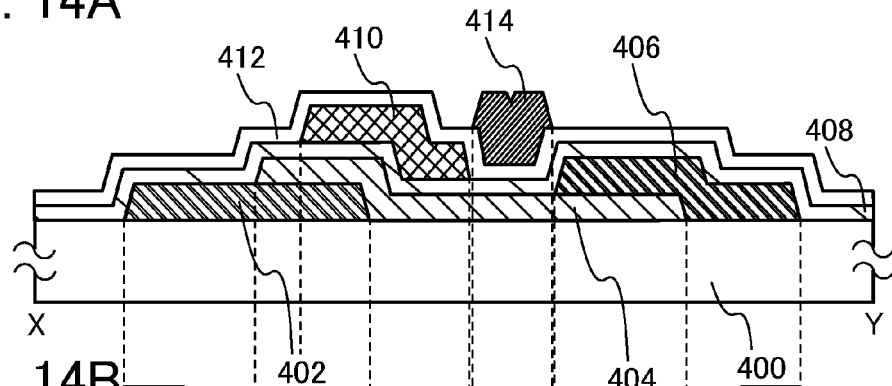
FIGS. 14A to 14C are a cross-sectional view and top views, which illustrate a semiconductor device that is one embodiment of the present invention.
Figure 14B:
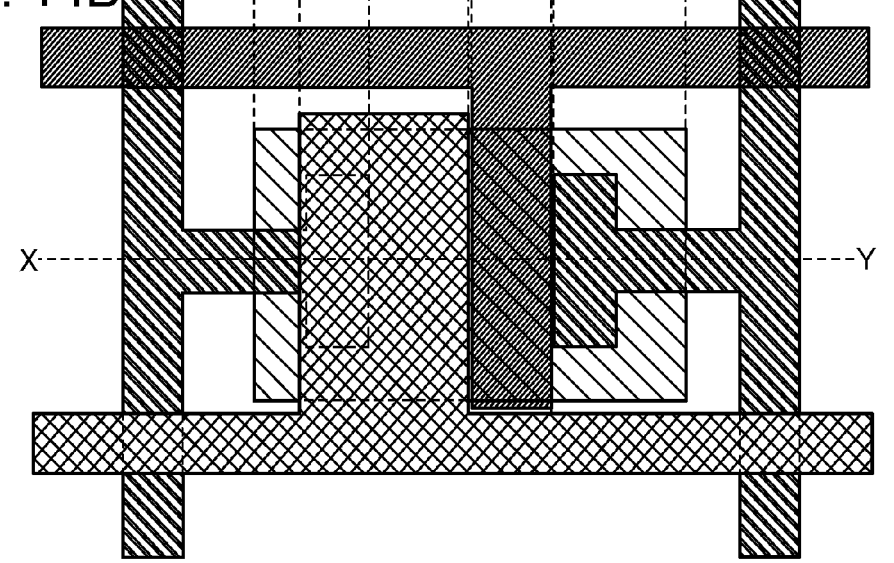
Figure 14C:
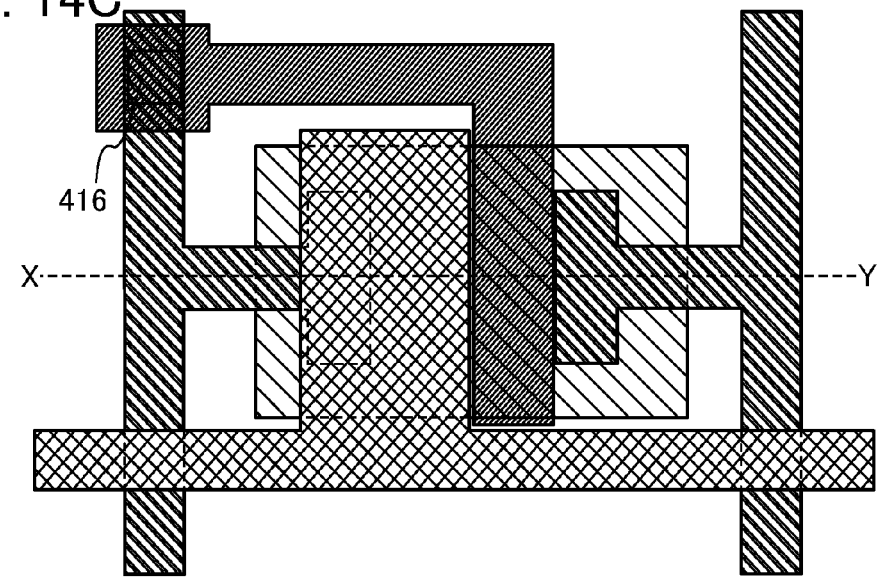

FIGS. 14A to 14C illustrate a semiconductor device of this embodiment. FIG. 14A is a cross-sectional view of the semiconductor device that is one embodiment of the present invention. FIG. 14B is an example of a top view of the semiconductor device of this embodiment. FIG. 14C is another example of a top view of the semiconductor device of this embodiment. Note that FIG. 14A is a cross-sectional view taken along line X-Y illustrated in FIGS. 14B and 14C.

The semiconductor device illustrated in FIGS. 14A and 14B includes a source electrode 402 provided over a substrate 400, a semiconductor layer 404 provided in contact with the source electrode 402, a drain electrode 406 provided in contact with the oxide semiconductor layer 404, a first insulating layer 408 provided over at least the semiconductor layer 404, a gate electrode 410 provided over the first insulating layer 408 to overlap with the source electrode 402 and the semiconductor layer 404 and not to overlap with the drain electrode 406, a second insulating layer 412 provided over the gate electrode 410, and an electric-field control electrode 414 provided to overlap with the semiconductor layer 404 and a region between the gate electrode 410 and the drain electrode 406.

Note that the potential of the electric-field control electrode 414 may be higher than or equal to the potential of the source electrode 402 and lower than the potential of the gate electrode 410. It is preferable that the electric-field control electrode 414 be connected to the source electrode 402 through an opening portion 416 as illustrated in FIG. 14C.

Note that without limitation to the structure illustrated in FIGS. 14A to 14C, the gate electrode 410 and the electric-field control electrode 414 may be formed using the same layer.

This application is based on Japanese Patent Application serial no. 2010-196439 filed with Japan Patent Office on Sep. 2, 2010, the entire contents of which are hereby incorporated by reference.

What is claimed is:

1. A semiconductor device comprising:
a source electrode and a drain electrode being apart from each other;
a semiconductor layer being in electrical contact with the source electrode and the drain electrode;
a first insulating layer over at least the semiconductor layer;
a gate electrode over the first insulating layer;
a second insulating layer over at least the gate electrode; and
an electric-field control electrode over the second insulating layer,
wherein the gate electrode overlaps with a first region of the semiconductor layer and the source electrode,
wherein the gate electrode does not overlap with the drain electrode,
wherein the electric-field control electrode overlaps with a second region of the semiconductor layer and is provided between the gate electrode and the drain electrode, and
wherein the electric-field control electrode is electrically connected to the source electrode.

2. The semiconductor device according to claim 1, wherein a potential of the electric-field control electrode is higher than or equal to a potential of the source electrode and lower than a potential of the gate electrode.

3. The semiconductor device according to claim 1, wherein the semiconductor layer is an oxide semiconductor layer.

4. A semiconductor device comprising:
a source electrode and a drain electrode being apart from each other;
a semiconductor layer being in electrical contact with the source electrode and the drain electrode;
a first insulating layer over at least the semiconductor layer;
a gate electrode over the first insulating layer;
a second insulating layer over at least the gate electrode;
an electric-field control electrode over the second insulating layer;
a first resistor provided between the source electrode and the gate electrode; and
a second resistor provided between the source electrode and the gate electrode and between the source electrode and the electric-field control electrode,
wherein the gate electrode overlaps with a first region of the semiconductor layer and the source electrode,
wherein the gate electrode does not overlap with the drain electrode,
wherein the electric-field control electrode overlaps with a second region of the semiconductor layer and is provided between the gate electrode and the drain electrode.

5. The semiconductor device according to claim 4, wherein the first resistor and the second resistor are formed from a same layer as the electric-field control electrode.

6. The semiconductor device according to claim 4, wherein the semiconductor layer is an oxide semiconductor layer.

7. A semiconductor device comprising:
a gate electrode and an electric-field control electrode being apart from each other;
a first insulating layer over the gate electrode and the electric-field control electrode;
a semiconductor layer over the first insulating layer;
a source electrode being on and in electrical contact with the semiconductor layer and overlapping with the gate electrode; and
a drain electrode over the semiconductor layer to be apart from the source electrode,
wherein the semiconductor layer overlaps with the gate electrode and the electric-field control electrode,
wherein the drain electrode does not overlap with the electric-field control electrode, and
wherein the electric-field control electrode is electrically connected to the source electrode.

8. The semiconductor device according to claim 7,
wherein a potential of the electric-field control electrode is higher than or equal to a potential of the source electrode and lower than a potential of the gate electrode.

9. The semiconductor device according to claim 7,
wherein the semiconductor layer is an oxide semiconductor layer.

10. A semiconductor device comprising:
a gate electrode and a drain electrode being apart from each other;
a first insulating layer over the gate electrode and the drain electrode;
a semiconductor layer being on and in electrical contact with the drain electrode and overlapping with the gate electrode;
a source electrode being on and in electrical contact with the semiconductor layer and overlapping with the gate electrode;
a second insulating layer over at least the semiconductor layer;
an electric-field control electrode over the second insulating layer; and
a wiring over the second insulating layer,
wherein the electric-field control electrode is provided between the gate electrode and the drain electrode,
wherein the electric-field control electrode is electrically connected to the source electrode, and
wherein the wiring is in electrical contact with the drain electrode in an opening portion provided in the first insulating layer.

11. The semiconductor device according to claim 10,
wherein a potential of the electric-field control electrode is higher than or equal to a potential of the source electrode and lower than a potential of the gate electrode.

12. The semiconductor device according to claim 10,
wherein the semiconductor layer is an oxide semiconductor layer.

* * * * *